(12) United States Patent
Pavier

(10) Patent No.: US 11,506,475 B2
(45) Date of Patent: Nov. 22, 2022

(54) ELECTRONIC FUZE FOR PROJECTILE

(71) Applicant: NEXTER MUNITIONS, Versailles (FR)

(72) Inventor: Julien Pavier, Bourges (FR)

(73) Assignee: NEXTER MUNITIONS, Versailles (FR)

( * ) Notice: Subject to any disclaimer, the term of this patent is extended or adjusted under 35 U.S.C. 154(b) by 0 days.

(21) Appl. No.: 17/470,959

(22) Filed: Sep. 9, 2021

(65) Prior Publication Data

US 2022/0107165 A1    Apr. 7, 2022

(30) Foreign Application Priority Data

Sep. 25, 2020    (FR) ........................................ 2009700

(51) Int. Cl.
*F42C 11/00*  (2006.01)
*F42C 19/06*  (2006.01)

(52) U.S. Cl.
CPC ............ *F42C 19/06* (2013.01); *F42C 11/001* (2013.01)

(58) Field of Classification Search
CPC ........ F42C 11/00; F42C 11/001; F42C 19/06; F42C 99/00
See application file for complete search history.

(56) References Cited

U.S. PATENT DOCUMENTS

| | | | |
|---|---|---|---|
| 3,652,333 A | 3/1972 | Warren | |
| 4,962,706 A * | 10/1990 | Ivermee | F42C 11/065 102/206 |
| 5,461,545 A | 10/1995 | Leroy et al. | |
| 6,655,289 B1 * | 12/2003 | Bornheim | F42B 3/121 102/275.12 |
| 2005/0115440 A1 | 6/2005 | Zimmerman et al. | |
| 2021/0396500 A1 * | 12/2021 | Kadavanich | F42B 12/02 |

FOREIGN PATENT DOCUMENTS

| | | |
|---|---|---|
| DE | 23 47 049 A1 | 2/1975 |
| FR | 2 666 190 A1 | 2/1992 |
| FR | 2 713 396 A1 | 6/1995 |

OTHER PUBLICATIONS

Jun. 9, 2021 Search Report issued in French Patent Application No. 2009700.
Jun. 9, 2021 Written Opinion issued in French Patent Application No. 2009700.

* cited by examiner

*Primary Examiner* — J. Woodrow Eldred
(74) *Attorney, Agent, or Firm* — Oliff PLC

(57) ABSTRACT

An electronic fuze for a projectile, the electronic fuze including at least one electronic board arranged in a housing of the body of the projectile, the electronic board being encapsulated in a block of protective material. The electronic board is secured to at least one support rod partially encapsulated in the block of protective material. The support rod is inserted through a hole in a wall integral with the body of the projectile, and the support rod is secured to the wall by a fastening device. A first decoupling devices is interposed between the block of protective material and the wall and a second decoupling device is interposed between the fastening device and the wall. The electronic board is located towards a front part of the projectile and the wall is located towards a rear part of the projectile.

7 Claims, 2 Drawing Sheets

[Fig. 1]
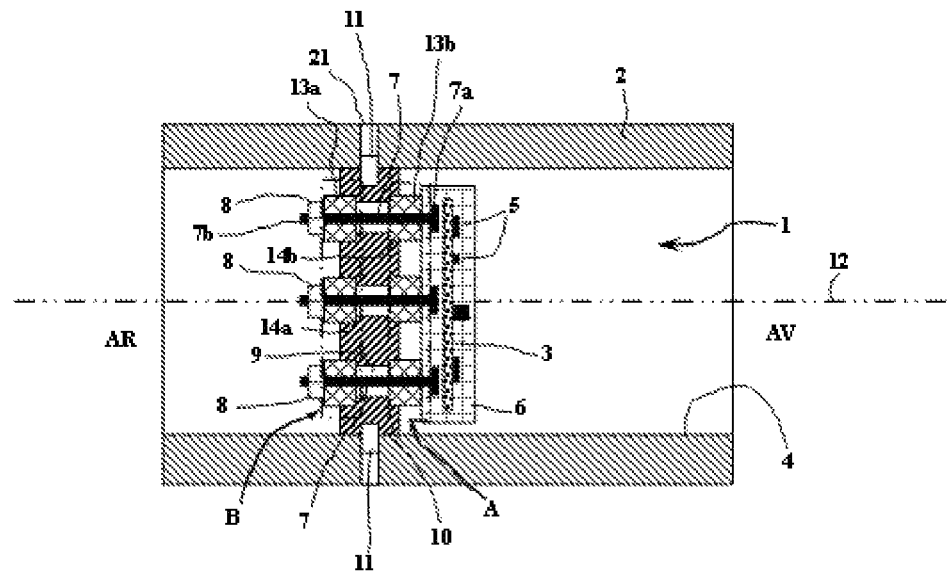
[Fig. 2]
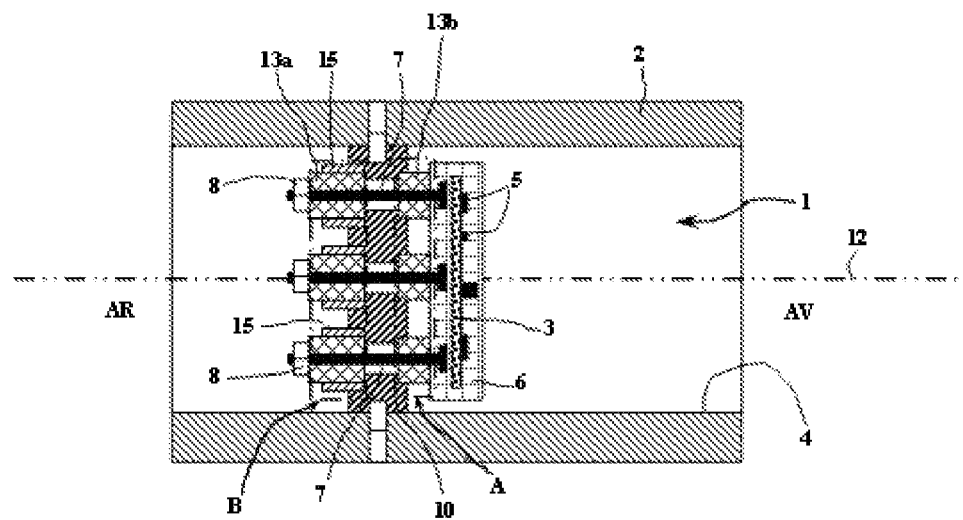

[Fig. 3]
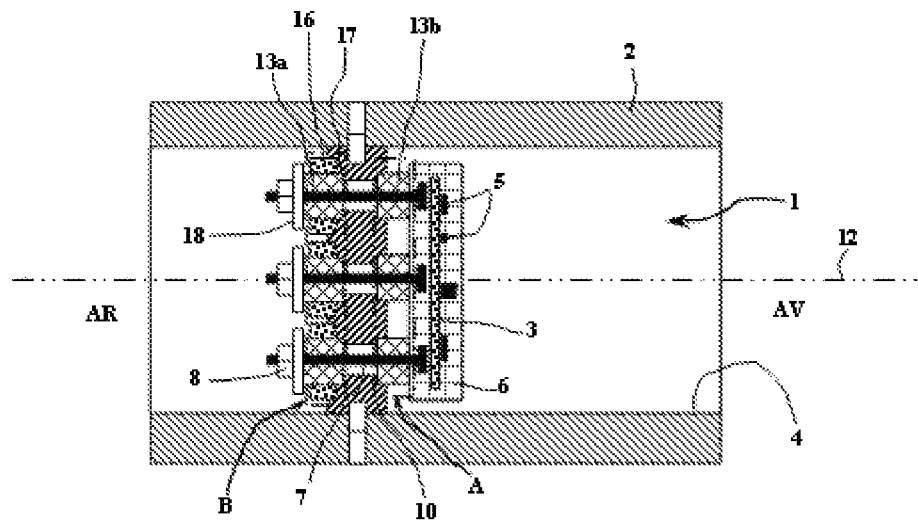
[Fig. 4]
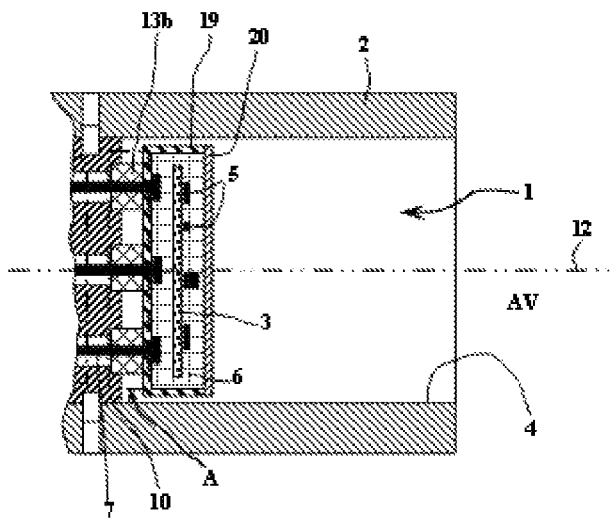

ELECTRONIC FUZE FOR PROJECTILE

The technical field of the invention is that of electronic fuzes for projectiles.

Projectile fuzes are devices that ensure that the projectile is triggered in response to certain events: impact on a target, time elapsed after fire, proximity to a given target, etc.

While fuzes that are sensitive to impact alone are the simplest and are completely mechanical, fuzes that detect a time or proximity to a target, or even a delay after impact, or that have several possible modes of operation (programmable by a user), incorporate one or more electronic boards.

This raises the problem of protecting these electronic boards against shock and vibration.

Indeed, the electronic boards must be able to withstand projectile fire constraints: accelerations of about 981,000 m/s$^2$ for medium-caliber projectiles (caliber less than 50 mm) and accelerations of about 150,000 m/s$^2$ for large-caliber projectiles (caliber greater than 50 mm).

They must also be able to withstand vibrations that occur during the logistical transport and movement phases of the projectile in the loading devices.

Finally, they must be able to withstand shocks that may occur on the trajectory: exiting the muzzle, crossing light obstacles such as branches or add-on protections of targets.

A conventional solution to protect electronic boards is to encapsulate them in a layer of resin that confers to the electronic board a certain stiffness that prevents it from bending.

The encapsulated board is then embedded in a damping block, for example of elastomer, to dampen the vibrations.

These encapsulation means are for example described in the patents: FR2713396 and FR2666190.

However, the known encapsulation means have drawbacks.

They most often require total encapsulation of the boards in the projectile body, which complicates the projectile manufacturing and assembling process and prohibits any subsequent disassembly.

Furthermore, the known means are insufficient to protect electronic boards against shocks occurring on the trajectory, such as impacts on add-on protection plates.

It is the purpose of the invention to propose an electronic fuze that facilitates its integration into a projectile without diminishing the protection of the one or more electronic boards that compose it.

It is another purpose to propose an electronic fuze whose shock and vibration resistance characteristics can be easily adapted to suit particular operational needs.

The invention thus relates to an electronic fuze for a projectile, the electronic fuze including at least one electronic board disposed in a housing of the body of the projectile, the electronic board being encapsulated in a block of protective material, the electronic fuze being characterized in that the electronic board is secured to at least one support rod partially encapsulated in the block of protective material, the support rod being inserted through a hole in a wall integral with the body of the projectile, the support rod being secured to the wall by a fastening means, a first decoupling means being interposed between the block of protective material and the wall and a second decoupling means being interposed between the fastening means and the wall, the electronic board being located towards a front part of the projectile and the wall being located towards a rear part of the projectile.

In a particular embodiment, the first and/or second decoupling means may include at least one elastically deformable means.

Advantageously, the elastically deformable means may consist of a spring and/or at least one deformable washer and/or at least one elastomer tube.

In a further embodiment, the second decoupling means may include at least one energy absorbing device.

In a particular embodiment, the energy absorbing device may include an elastomer tube inserted in a metal sheath, the fastening means bearing against the elastomer tube so as to be able to crush the elastomer tube by inertia upon impact of the projectile on a target.

In a particular embodiment, the energy absorbing device may include an elastomer tube inserted into a layer of aluminum foam or polymer foam, the fastening means having an enlarged head capable of crushing the elastomer tube and the layer of aluminum foam or polymer foam by inertia upon impact of the projectile on a target.

In one variant, the block of protective material may be arranged in a casing with the support rod(s) passing through a bottom wall of the casing.

The invention will be better understood on reading the following description of different embodiments, description made with reference to the annexed drawings and in which:

FIG. 1 shows a schematic view in longitudinal section of a fuze according to a first embodiment;

FIG. 2 shows a schematic view in longitudinal section of a fuze according to a second embodiment;

FIG. 3 shows a schematic view in longitudinal section of a fuze according to a third embodiment;

FIG. 4 shows a partial view in longitudinal section of a variant of a fuze according to the invention.

Referring to FIG. 1, an electronic fuze 1 according to a first embodiment is intended to equip a projectile, of which only a part of the body 2 is shown. The body 2 is rotationally symmetrical along the axis 12 (for example cylindrical).

This electronic fuze 1 includes at least one electronic board 3 which is arranged in a housing 4 of the projectile body 2.

The board carries a number of electronic components 5 and is encapsulated in a block 6 of protective material, possibly surrounded by a metal casing.

The protective material may be a synthetic resin, for example an epoxy type resin.

The function of this encapsulation block 6 is to stiffen the board 3 to enable it to withstand the fire acceleration without undergoing bending deformations that would be likely to break the conductive traces of the electronic board.

Such a rigid encapsulation is well known to the skilled person and is described, for example, in patents FR2713396 and FR2666190. As proposed in these patents, the encapsulation may possibly include several successive layers to ensure different thermal insulation performances at the various electronic components 5.

In accordance with the invention, the electronic board 3 is secured to at least one support rod 7 that is partially encapsulated in the protective block 6.

Each support rod 7 here has a head 7a which is embedded in the protective block 6 and a threaded part 7b to which a nut 8 can be attached.

It is possible to glue the head 7a to the board 3 before encapsulation in the protective block 6.

It is also possible (as shown in the figures) to place the electronic board 3 at a distance from the heads 7a of the rods, and then to embed both the heads 7a of the rods and the board 3 in the same block 6. Such an arrangement ensures a decoupling between the support rods 7 and the board 3. The electronic board 3 and the rods 7 are then secured solely by means of the block 6.

Alternatively, as shown in FIG. 4, the heads 7a can be secured to a casing 19 surrounding the block 6 containing the board 3.

In the described embodiments there are three support rods 7 for each fuze 1. A different number of rods is of course possible. Depending on the size of the board 3, at least one support rod (small board) or, for larger electronic boards, 4 to 10 support rods, evenly distributed angularly around the axis 12 of the projectile, may be provided.

Each support rod 7 is inserted through a hole 9 in a wall 10 which is integral with the projectile body 2.

In the embodiments described, the wall 10 is secured to the body 2 by one or more radial pins 11, each of which passes through a radial hole 21 in the body 2. It is understood that any other method of attachment is possible: threading, welding. The wall 10 could also be formed in one piece with the body 2.

The rod 7 is secured to the wall 10 by a fastening means, which here includes the nut 8.

In accordance with the invention, a first decoupling means A is interposed between the block 6 and the wall 10 and a second decoupling means B is interposed between the fastening means 8 and the wall 10. These two decoupling means are distributed on the different rods 7 as will be described below. The decoupling means A or B of each rod is identical to that of the neighboring rod.

It is clear that it would be possible, in order to take into account particular geometries or different mass distributions on the electronic board, to modify the characteristics of the decoupling means A and B from one rod 7 to another.

Furthermore, the board 3 is located towards a front part AV of the projectile while the wall 10 is located towards a rear part AR of the projectile. The wall 10 is thus located behind the board 3 in the direction of travel of the projectile.

As a result, when the projectile is fired, the board 3 is driven inertially towards the wall 10, whereas on impact with a target, the board 3 is driven inertially away from the wall 10, towards the front AV.

It can be seen that the first decoupling means A is heavily loaded when the projectile is fired and the second decoupling means B is heavily loaded on impact with a target. As these two means of decoupling are separate, it becomes possible to dimension them in different ways to take into account the stresses they have to absorb.

In accordance with the first embodiment shown in FIG. 1, each decoupling means A and B includes at least one elastically deformable means which is here a tube 13a or 13b of an elastomeric material.

Each tube 13a or 13b is housed in a counterbore 14a or 14b of the wall 10. When the nut 8 is tightened, it slightly compresses the two tubes 13a and 13b through which the rod 7 passes.

The stiffness of the elastomer tubes 13a and 13b is chosen by the skilled person depending on the mass of the block 6 enclosing the board 3 (and possibly the casing 19) and the level of frequency to be damped during fire (means A) or on impact (means B).

The tubes 13a and 13b make it possible to decouple the electronic board 3 from the wall 10 and ensure the damping of vibrations that the wall 10 could otherwise transmit to the board 3.

Tightening the nut 8 provides a preload that reduces the movement of the board 3 that could be caused by fire below an acceleration threshold.

In addition, the elastomer tubes 13a, 13b ensure transverse decoupling of the board 3, thus avoiding vibrations, whatever the direction of the mechanical stress received.

This design is particularly suitable for projectiles that may be subjected to high transverse forces (e.g. during travel through the barrel of the weapon).

It would be possible to interpose a washer between the nut 8 and the elastomer tube 13a. This would allow a better distribution of the pre-stressing forces and prevent shearing of the elastomer tube 13a, 13b during tightening.

Other elastically deformable means would be possible. For example, one and/or other of the elastomer tubes 13a, 13b could be replaced by a compression spring, or by a stack of spring washers. Such solutions make it possible to increase the stiffness of the connection between the electronic board 3 and the wall 10 at one or other decoupling means A or B. The stiffness of the connection is adapted to the mass of the block 6 and to the vibration frequencies from which the electronic board 3 is to be isolated (high vibration frequencies of the shell body).

FIG. 2 shows a second embodiment of the invention which differs from the first in the nature of the second decoupling means B.

In accordance with this embodiment, the second decoupling means B includes a device for the controlled absorption of impact energy, in particular by irreversible deformation of a material.

The aim is to dampen the energy received following an impact, for example on a target. Thus the electronic board 3 will not be damaged during such an impact, the deceleration level of which is very high ($-300,000$ m/s$^2$) and it will be fully operational, for example to control the triggering of the projectile after passing through a wall or an add-on protection.

In the embodiment shown in FIG. 2, the energy absorbing device includes an elastomer tube 13a but which is inserted into a metal sheath 15, for example of copper or brass.

The fastening means 8 bears against the elastomer tube 13a, either directly or with the interposition of a washer (not shown).

Thus on impact on a target, the fastening means 8 will crush the elastomer tube 13a which will expand radially and cause irreversible plastic deformation of the metal sheath 15, thus consuming some of the energy of the impact.

It is possible to control the energy consumption by adjusting the length and thickness of the sheath 15. The electronic board 3 is thus effectively protected against impacts on a target.

In addition, the first decoupling means constituted by the elastomer tube 13b ensures protection during fire and with respect to vibrations, whatever the direction of the force. The stiffness of the tubes 13b may be different from that of the tubes 13a depending on the forces encountered and the frequencies to be filtered during fire.

FIG. 3 shows a third embodiment of the invention which differs from the previous one in the nature of the device constituting the second decoupling means B.

In this embodiment, the elastomer tube 13a is inserted into a layer 16 of aluminum foam or polymer foam.

This foam layer 16 can, as shown in FIG. 3, be accommodated in a counterbore 17 provided in the wall 10. It can be glued to the wall 10 during assembly.

Alternatively, a single layer of foam 16 can be placed, through which all the support rods 7 can pass. Such an arrangement simplifies the assembly. This single layer 16 can be glued to the wall 10.

As can be seen in FIG. 3, the fastening means 8 has an enlarged head 18 which may be a metal washer or a flange integral with the nut 8.

The enlarged head 18 is pressed against the elastomer tube 13a when the nut 8 is tightened. Upon impact of the projectile on a target, the enlarged head 18 can crush the tube 13a and then the foam layer 16 by inertia.

The crushing (irreversible deformation) of the foam layer consumes part of the impact energy and protects the electronic board 3.

This embodiment allows for a higher level of shock absorption than that provided by the previous type. This level depends on the stiffness of the foam that will have been chosen. Furthermore, a layer of aluminum foam or polymer foam can be crushed without radial expansion, which facilitates the integration of the device into a piece of ammunition.

FIG. 4 shows in part an alternative embodiment in which the resin block 6 encapsulating the board 3 is arranged in casing 19 which may be closed by a cover 20. The block 6 provides sealing and stiffness, the cover 20 being optional.

It can be seen that the rods 7 penetrate into the casing 19 and bear, with their enlarged heads 7a, against the bottom of the casing 19. This embodiment facilitates integration and assembly. The casing 19 can be fitted with the rods 7 and then receive the board 3 and the block 6, which is cast in the casing 19 without the need for a separate mold. The casing 19 is made of sheet aluminum, for example.

It is clear that this variant can be associated with the various embodiments of the second decoupling means B that have been described previously with reference to FIGS. 1 to 3.

For the sake of simplicity, the figures show fuzes with only one electronic board 3. It is clear that it is possible to define a fuze with several electronic boards 3, whether or not encapsulated in the same resin block 6.

In each case the encapsulated electronic board(s) 3 will be connected to a wall 10 using fastening means including different decoupling means upstream and downstream of the wall.

The invention claimed is:

1. Electronic fuze for a projectile, the electronic fuze including at least one electronic board disposed in a housing of the body of the projectile, the electronic board being encapsulated in a block of protective material, wherein the electronic board is secured to at least one support rod partially encapsulated in the block of protective material, the support rod being inserted through a hole in a wall integral with the body of the projectile, the support rod being secured to the wall by a fastening means, a first decoupling means being interposed between the block of protective material and the wall and a second decoupling means being interposed between the fastening means and the wall, the electronic board being located towards a front part of the projectile and the wall being located towards a rear part of the projectile.

2. The electronic fuze according to claim 1, wherein the first and/or second decoupling means includes at least one elastically deformable means.

3. The electronic fuze according to claim 2, wherein the elastically deformable means consists of one or more among a spring, at least one deformable washer and at least one elastomer tube.

4. The electronic fuze according to claim 1, wherein the second decoupling means includes at least one energy absorbing device.

5. The electronic fuze according to claim 4, wherein the energy absorbing device includes an elastomer tube inserted in a metal sheath, the fastening means bearing against the elastomer tube so as to be able to crush the elastomer tube by inertia upon impact of the projectile on a target.

6. The electronic fuze as claimed in claim 4, wherein the energy absorbing device includes an elastomer tube inserted in a layer of aluminum foam or polymer foam, the fastening means having an enlarged head capable of crushing the elastomer tube and the layer of aluminum foam or polymer foam by inertia upon impact of the projectile on a target.

7. The electronic fuze according to claim 1, wherein the block of protective material is arranged in a casing with the at least one support rod passing through a bottom wall of the casing.

* * * * *